(12) United States Patent
Yilmaz

(10) Patent No.: US 8,148,758 B2
(45) Date of Patent: Apr. 3, 2012

(54) HIGH VOLTAGE SEMICONDUCTOR DEVICE WITH JFET REGIONS CONTAINING DIELECTRICALLY ISOLATED JUNCTIONS AND METHOD OF FABRICATING THE SAME

(75) Inventor: Hamza Yilmaz, Saratoga, CA (US)

(73) Assignee: Alpha and Omega Semiconductor Inc., Sunnyvale, CA (US)

(*) Notice: Subject to any disclaimer, the term of this patent is extended or adjusted under 35 U.S.C. 154(b) by 0 days.

(21) Appl. No.: 12/928,682

(22) Filed: Dec. 16, 2010

(65) Prior Publication Data

US 2011/0089492 A1  Apr. 21, 2011

Related U.S. Application Data

(60) Continuation of application No. 12/586,887, filed on Sep. 29, 2009, now Pat. No. 7,867,855, which is a division of application No. 11/157,601, filed on Jun. 21, 2005, now Pat. No. 7,629,631.

(51) Int. Cl.
*H01L 29/72* (2006.01)

(52) U.S. Cl. ........ 257/260; 257/141; 257/262; 257/287; 257/343; 257/492; 257/493; 257/577; 438/138; 438/259; 438/270

(58) Field of Classification Search .......... 257/141, 257/260, 262, 287, 343, 492, 493, 577; 438/138, 438/259, 270

See application file for complete search history.

(56) References Cited

U.S. PATENT DOCUMENTS

| | | | | |
|---|---|---|---|---|
| 5,488,236 A | * | 1/1996 | Baliga et al. | 257/132 |
| 6,534,367 B2 | * | 3/2003 | Farr et al. | 438/270 |
| 6,800,903 B2 | * | 10/2004 | Rumennik et al. | 257/343 |

* cited by examiner

Primary Examiner — Edward Wojciechowicz

(74) Attorney, Agent, or Firm — Patentability Associates

(57) ABSTRACT

A high-voltage field-effect device contains an extended drain or "drift" region including an embedded stack of JFET regions separated by intervening layers of the drift region. Each of the JFET regions is filled with material of an opposite conductivity type to that of the drift region, and the floor and ceiling of each JFET region is lined with an oxide layer. When the device is blocking a voltage in the off condition, the semiconductor material inside the JFET regions and in the drift region that separates the JFET regions is depleted. This improves the voltage-blocking ability of the device while conserving chip area. The oxide layer prevents dopant from the JFET regions from diffusing into the drift region.

18 Claims, 21 Drawing Sheets

HIGH VOLTAGE SEMICONDUCTOR DEVICE WITH JFET REGIONS CONTAINING DIELECTRICALLY ISOLATED JUNCTIONS AND METHOD OF FABRICATING THE SAME

CROSS-REFERENCE TO RELATED APPLICATION

This application is a continuation of application Ser. No. 12/586,887, filed Sep. 29, 2009, now U.S. Pat. No. 7,867,855, which is a divisional of application Ser. No. 11/157,601, filed Jun. 21, 2005, now U.S. Pat. No. 7,629,631, each of which is incorporated herein by reference in its entirety.

FIELD OF THE INVENTION

This invention relates to high voltage devices and in particular to a high-voltage field-effect transistor such as a metal-oxide-silicon field-effect transistor or an insulated gate bipolar transistor.

BACKGROUND

In the field of field-effect transistors there is a continual quest for devices that approximate an ideal switch, that is, devices that have a very low-resistance when they are turned on and a high voltage-blocking capability when they are turned off. Another objective is a size that occupies minimal "real estate" on today's miniaturized semiconductor chips.

In accordance with the Reduced Surface Field (RESURF) principle, it is known to provide an extended "drift" region in a field-effect transistor, which in a MOSFET is an extension of the drain region. The charge in the drain extension must be carefully controlled to obtain a high $V_{bd}$. The RESURF principle was advanced in an article titled "High Voltage Thin Layer Devices (RESURF Devices)," by Appels and Vaes, IEDM Tech. Digest, pp. 238-241 (1979). The drift region permits a more gradual voltage drop across the terminals and reduces the possibility of avalanche breakdown in this area of the device. FIGS. 1 and 2 illustrate a MOSFET 10 that includes a drift region. FIG. 1 is a top view of MOSFET 10; FIG. 2 is a cross-sectional view of MOSFET 10 taken at cross-section 2-2 shown in FIG. 1. As shown in FIG. 1, MOSFET 10 is formed in a circular configuration, with the N+ drain region 110 at the center of the circle and the N+ source region 111 surrounding the N+ drain region 110.

As shown in the cross-sectional view of FIG. 2, the device is fabricated in an N epitaxial (epi) layer 119 that is grown on a P-substrate 114. A thick field oxide layer 118B is grown on the surface of N epi layer 119 between N+ source region 111 and N+ drain region 110, typically by a LOCOS (local oxidation of silicon) process. A gate 112, typically made of polycrystalline silicon (polysilicon), is deposited on top of a gate oxide layer 118A and steps up over field oxide layer 118B. A P body region 113 is formed in N epi layer 119, including a channel region 116 that lies directly below a gate oxide layer 118A. A P+ body contact region 115 provides an ohmic contact with P body region 113, which is shorted to N+ source region 111 via a source metal layer 112A. This helps to prevent the parasitic bipolar transistor composed of N+ source region 111, P body region 113 and N+ drain region 110 from turning on.

To increase the voltage-blocking capability of MOSFET 10, an extended drain or drift region 117 is interposed laterally between channel region 116 and N+ drain region 110. Drift region 117 is generally lightly-doped. When MOSFET is turned off, the voltage drop between N+ source region 111 and N+ drain region 110 is partially absorbed in drift region 117, increasing the ability of MOSFET 10 to withstand a large voltage.

This increased voltage-blocking capability comes at a price, however. When MOSFET 10 is turned on, the channel region 116 is inverted and current flows between N+ source region 111 and N+ drain region 110. The presence of the lightly-doped drift region 117 in the current path between N+ source region 111 and N+ drain region 110 increases the on-resistance of MOSFET 10.

U.S. Pat. No. 6,800,903 proposed an alternative solution, which is illustrated in FIG. 3. MOSFET 20 is for the most part constructed similarly to MOSFET 10, but a series of P buried layers 120 and 121 are implanted at different levels in drift region 117. P buried layers 120 and 121 may float electrically, or they may be tied to P-substrate 114, which is normally grounded.

When MOSFET 20 is in the off state, P buried layers 120 and 121 and the portions of N drift region 117 above and below and between P buried layers 120 and 121 are mutually depleted of free carriers. The portions of N drift region 117 that are above and below and between P buried layers 120 and 121 act as parallel JFET channels, and the current is effectively pinched off in these JFET channels when MOSFET 20 is turned off. This feature provides MOSFET 20 with a greater current-blocking capability that it would have if P buried layers 120 and 121 were not present. For this reason, the doping concentration of N drift region 117 can be higher than it would have to be in order to block current if P buried layers 120 and 121 were not present. For example, the '903 patent suggests that the combined charge in the portions of N drift region 117 above and below and between P buried layers 120 and 121 can be as high as $3 \times 10^{12}$ cm$^{-2}$, which reduces the on-resistance of the device to about one-third of what it would ordinarily be. To keep the strength of the electric field at a level below the critical level at which avalanche breakdown occurs, the charge in each of P buried layers 120 and 121 and the portions of N drift region 117 that are above and below and between them is balanced.

P buried layers 120 and 121 are formed by high-energy implants of a P-type dopant such as boron. The dose and energy of the implants are chosen to provide buried layers of the desired depth and charge concentration. Despite efforts to restrict the dopant to the desired location within the substrate, however, in practice the charge in the buried layers tends to diffuse outwards in three dimensions (both laterally and vertically), particularly if the device is subjected to any thermal processing after the buried layers are implanted. This outdiffusion of dopant makes the device difficult to manufacture.

In addition, a structure that includes alternating shallow P-type pillars in the N-drift region has been reported to improve the trade-off between on-resistance and breakdown voltage in lateral high voltage MOSFET's. See Il-Yong Park and C.A.T. Salama, "CMOS Compatible Super Junction LDMOST with N-buffer," Proc. Of 17$^{th}$ ISPSD conference, May 23-26, 2005, Santa Barbara, Calif.

The foregoing article and other ISPSD proceedings in the period 2000-2005 reference many other lateral super junction or charge control techniques for junction and SOI type lateral MOSFET's and IGBT's.

Nonetheless, all of these known charge control methods encounter problems with the dimensional control of PN junctions, especially junctions of the P-type dopant boron, during the subsequent process steps.

Thus it would be desirable to provide a field-effect device which has the current-blocking advantages of spaced regions of opposite conductivity in the drift region but in which the charge within the regions of opposite conductivity is better controlled. In particular, it would be desirable to limit the tendency of the charge to diffuse in at least two dimensions.

SUMMARY

A field-effect transistor according to this invention includes a source region of the first conductivity and a drain region of the first conductivity formed at the surface of a semiconductor die. The die may include a substrate and a layer (e.g., an epitaxial layer) grown on top of the substrate. A gate is formed over the surface of the die, separated from the surface by a gate dielectric layer, typically an oxide layer. The gate overlies a channel region of the transistor, which is of a second conductivity type opposite to the first conductivity type. Adjoining the drain region is a drift region of the first conductivity type, which is positioned generally between the drain region and the channel region. Located at least partially within the drift region are a plurality of JFET regions of the second conductivity type, which are separated by portions of the drift region. In accordance with this invention, the JFET regions are bounded laterally and/or vertically by a dielectric layer, typically an oxide layer, which prevents the second conductivity type dopant of the JFET regions from diffusing into the drift region.

In one group of embodiments, the die includes a substrate of the second conductivity type and each of the JFET regions extends from the surface of the die to the substrate. The JFET regions are separated laterally by portions of the drift region, and the lateral sides of the JFET regions are bounded by dielectric layers which prevent the second conductivity type dopant in each of the JFET regions from diffusing laterally into the drift region. The JFET regions may be arrayed radially around the drain region, linearly between the channel region and the drain region, or in some other geometric configuration. The vertical oxide walls confine the charge within the JFET regions and thus help to utilize the area of the chip more efficiently.

In another group of embodiments, the JFET regions are arranged as a vertical stack of buried layers within the drift region, the JFET regions being separated from each other by portions of the drift region. A dielectric layer is located at the upper boundary (ceiling) and lower boundary (floor) of each of the JFET regions and prevents the second conductivity dopant in the JFET regions from diffusing upwards or downwards into the drift region.

The invention also comprising methods of fabricating a field-effect transistor having JFET regions bounded laterally and/or vertically by a dielectric layer as described above.

The use of JFET regions according to this invention provides for a very efficient use of the lateral area of the chip and allows the doping concentration of the drift region to be higher than it would be if the JFET regions were not present.

DETAILED DESCRIPTION

Figure 1:
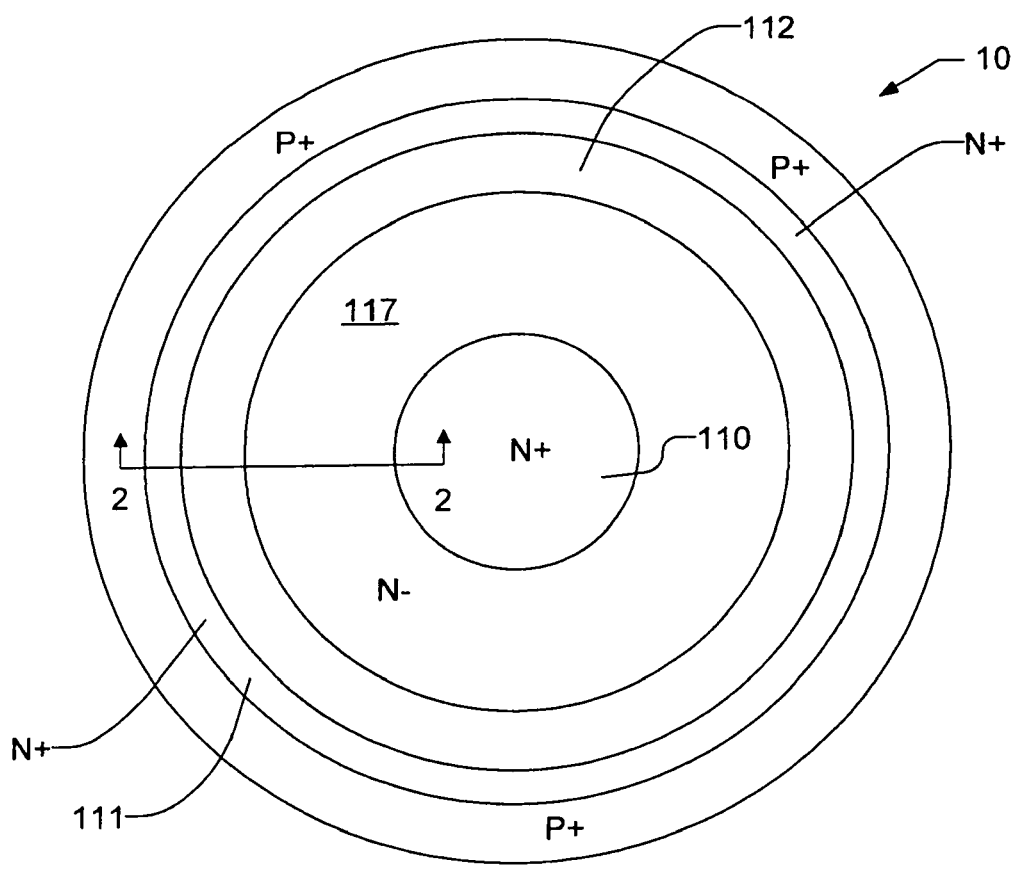
FIG. 1 is a top view of a conventional MOSFET having a circular configuration.
Figure 2:
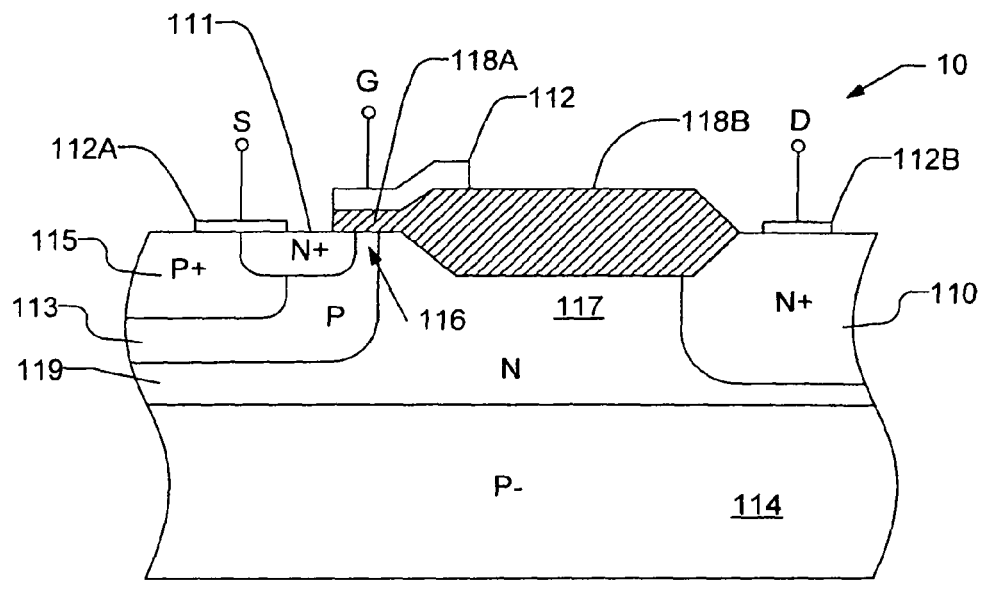
FIG. 2 is a cross-sectional view of the MOSFET taken at section 2-2 shown in FIG. 1.
Figure 3:
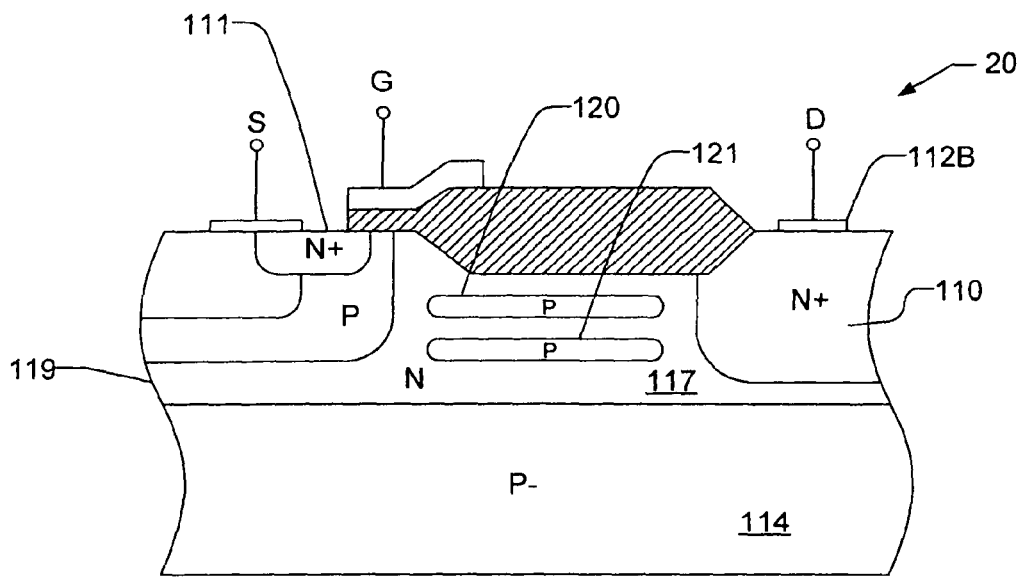
FIG. 3 is a cross-sectional view similar to FIG. 2 showing buried regions formed in the drift region of the MOSFET.
Figure 4:
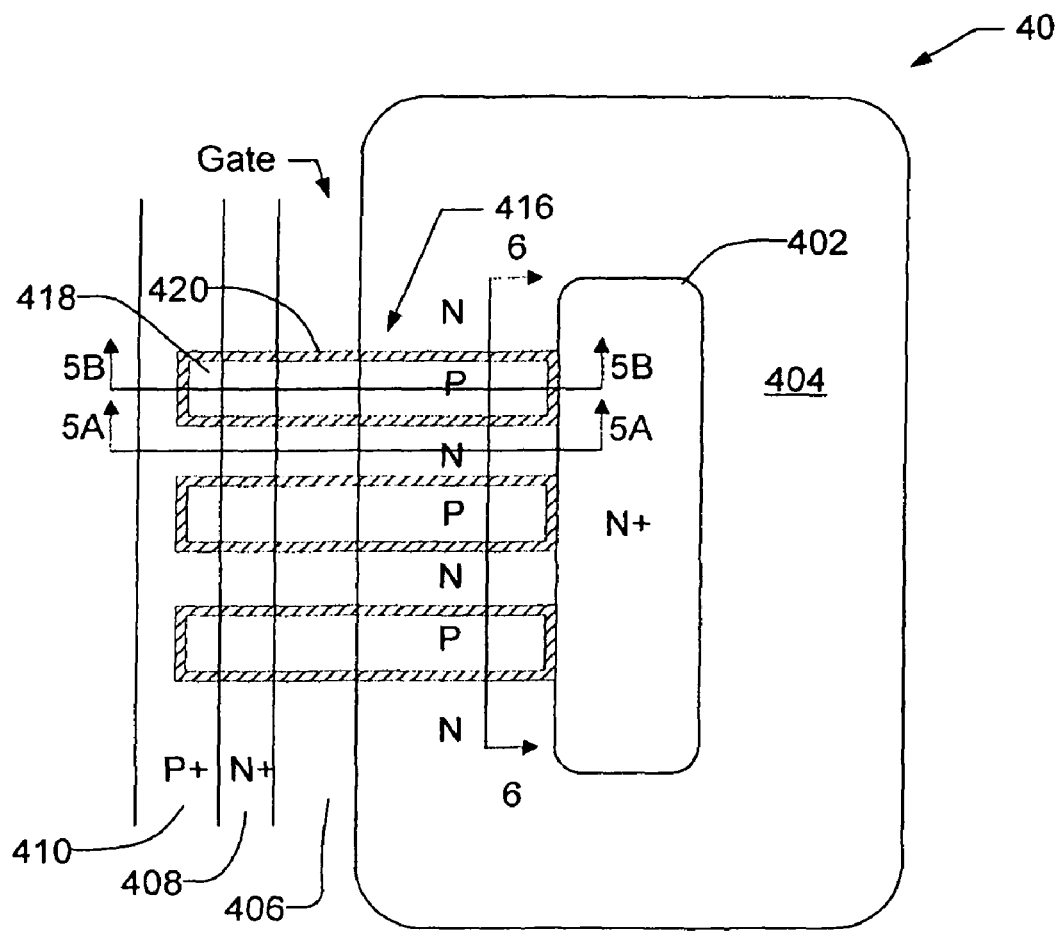
FIG. 4 is a top view of a MOSFET containing JFET regions in accordance with the invention.
Figure 5A:
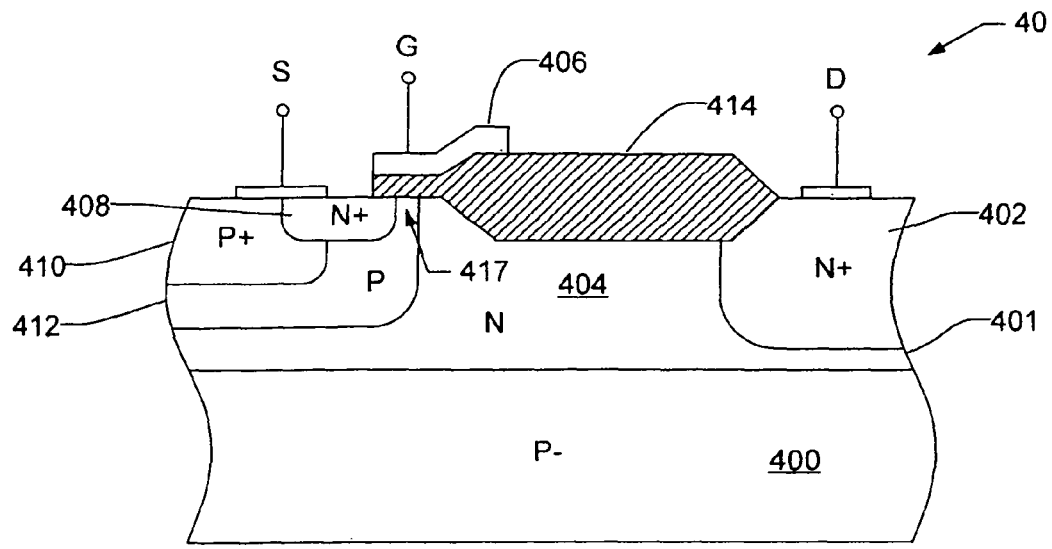
FIG. 5A is a cross-sectional view of the MOSFET taken at section 5A-5A in FIG. 4.
Figure 5B:
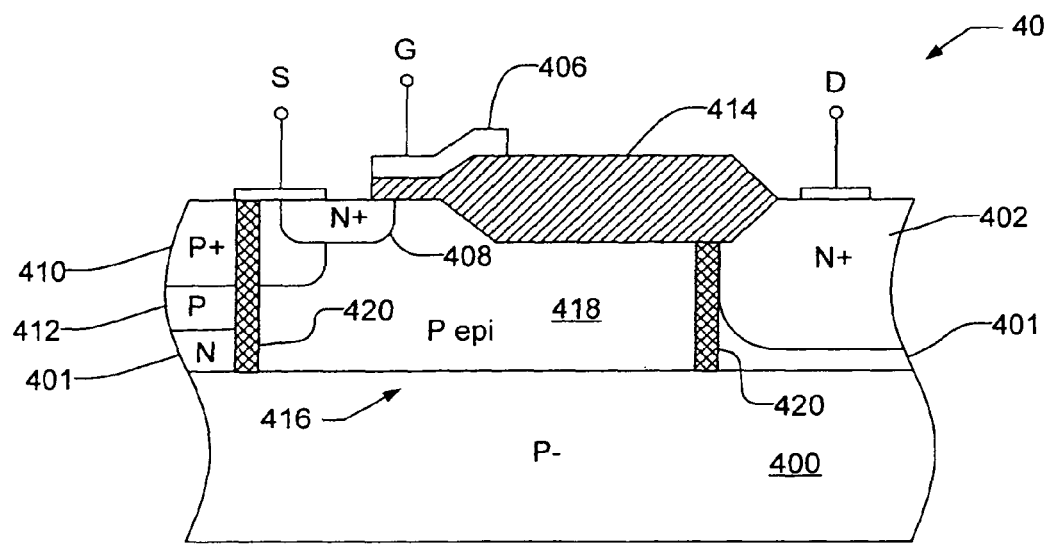
FIG. 5B is a cross-sectional view of the MOSFET taken at section 5B-5B in FIG. 4.
Figure 6:
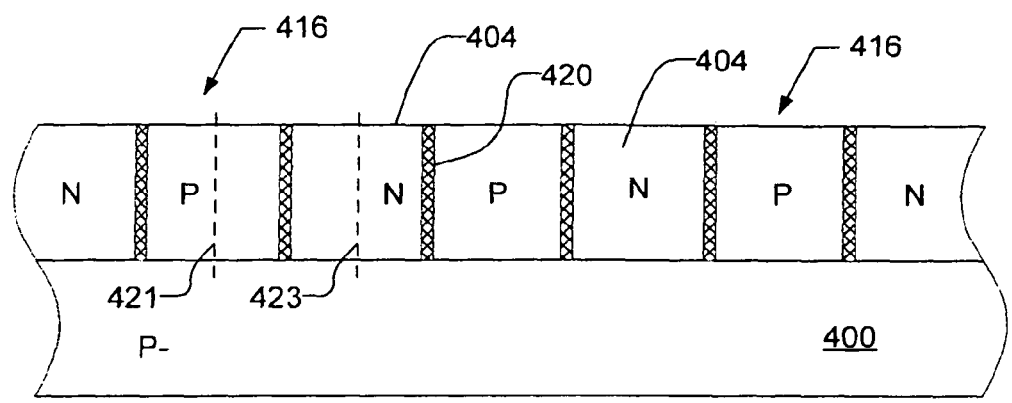
FIG. 6 is a cross-sectional view of the MOSFET taken at section 6-6 in FIG. 4.

FIG. 4 is a top view of a first embodiment according to the invention. FIG. 5A is a cross-sectional view taken at cross-section 5A-5A in FIG. 4. FIG. 5B is a cross-sectional view taken at cross-section 5B-5B in FIG. 4. FIG. 6 is a cross-sectional view taken at cross-section 6-6 in FIG. 4.

Referring first to FIG. 4, a top view of a MOSFET 40 is shown. In layout, MOSFET 40 is generally of a rectangular shape, with rounded corners. As shown in FIGS. 5A and 5B, MOSFET 40 is formed in an N-epitaxial (epi) layer 401 that overlies a P-substrate 400. An N+ drain region 402 is located at the center of the rectangle, and it is surrounded by an N+ source region 408. Overlying the surface of N-epi layer 401 is a gate 406, which also surrounds N+ drain region 402. Lying outward of N+ source region 408 is a P+ body contact region 410. As shown in FIG. 5A, a P body region 412 is formed adjacent to N+ source region 408, and a channel region 417 within P body region 412 directly underlies gate 406. An N drift region 404 separates N+ drain region 402 and channel region 417. Thus, proceeding outward from N+ drain region 402: N drift region 404, channel region 417, gate 406, N+ source region 408 and P+ body contact region 410 are in the shape of rectangles with rounded corners and surround N+ drain region 402. Note that, because of space limitations, only sections of gate 406, N+ source region 408 and P+ body contact region 410 are shown in FIG. 4.

Referring again to FIG. 4, a series of JFET regions 416 extend radially outward from N+ drain region 402. The structure of one of the JFET regions 416 is shown in FIG. 5B, which is a cross-sectional view taken at section 5B-5B shown in FIG. 4. As indicated, JFET region 416 is filled with P epi material 418. On the right, JFET region 416 abuts N+ drain region 402; on the left it extends into P+ body contact region 410. Vertically, JFET region 416 extends downward from the surface of the die to P-substrate 400.

Each of JFET regions 416 is laterally bounded by an oxide layer 420, which in accordance with the invention prevents the P-type dopant within JFET regions 416 from diffusing outwards into N-drift region 404. In this embodiment, there is no oxide layer at the floor of JFET regions 416.

Figure 7:
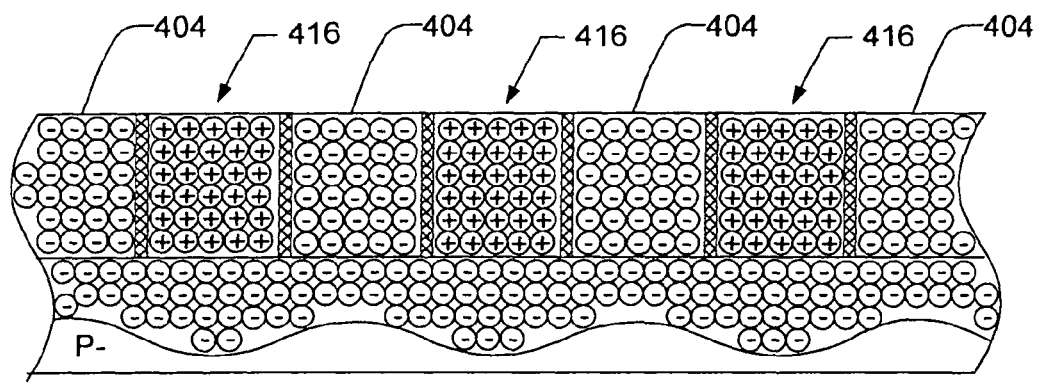
FIG. 7 is a cross-sectional view of the MOSFET that is similar to the cross-section of FIG. 6 showing the charge depletion that takes place in the JFET regions when the MOSFET is in a voltage blocking condition.

FIG. 6 shows how JFET regions 416 are arrayed laterally along section line 6-6 shown in FIG. 4. JFET regions 416 alternate with portions of N-drift region 404. When MOSFET 40 is turned off, JFET regions 416 and the intervening portions of N-drift region 404 become depleted, as illustrated in FIG. 7, which is taken at the same cross section as FIG. 6. As FIG. 7 indicates, a large portion of the P-substrate is also depleted. This effect can be obtained by balancing the charge in JFET regions 416 with the charge in the intervening portions of N-drift region 404. Thus the positive charge in the half of JFET region 416 to the right of dashed line 421 should equal the negative charge in the adjacent portion of N-drift region 404 to the left of dashed line 423.

Figure 8A:
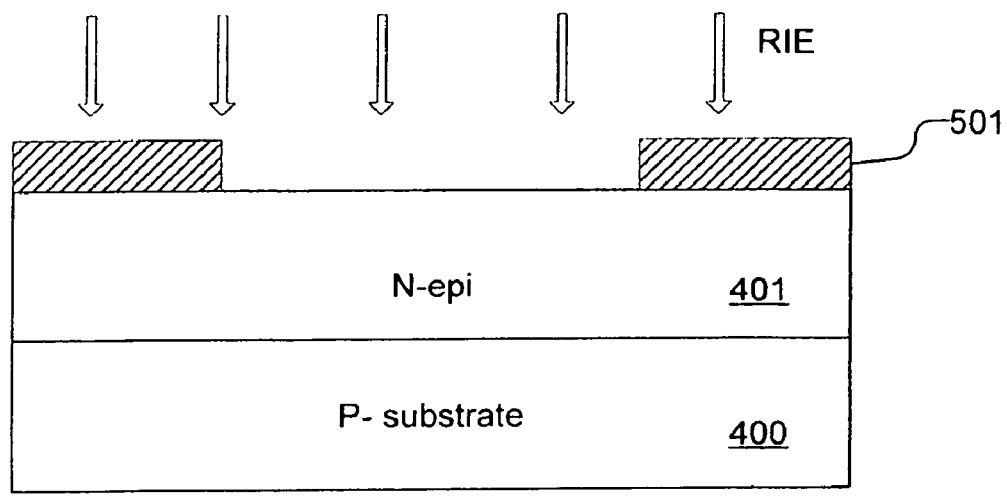
FIGS. 8A-8F illustrate the steps of a process of forming the JFET regions of this invention.
Figure 8B:
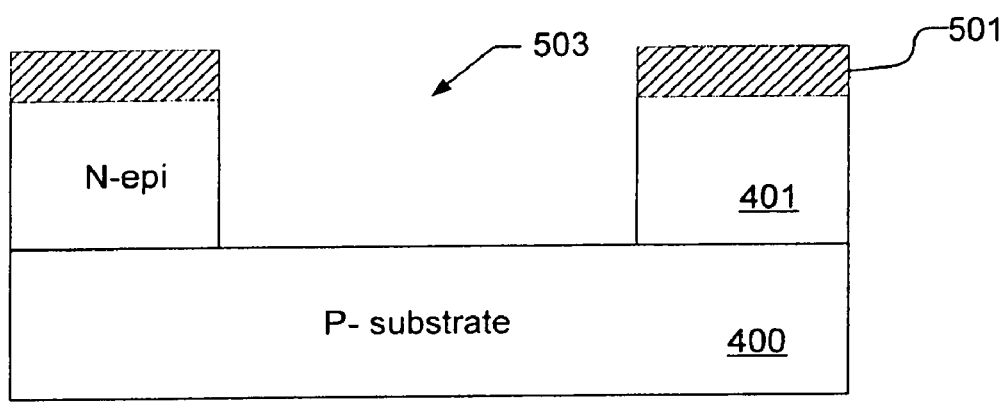
Figure 8C:
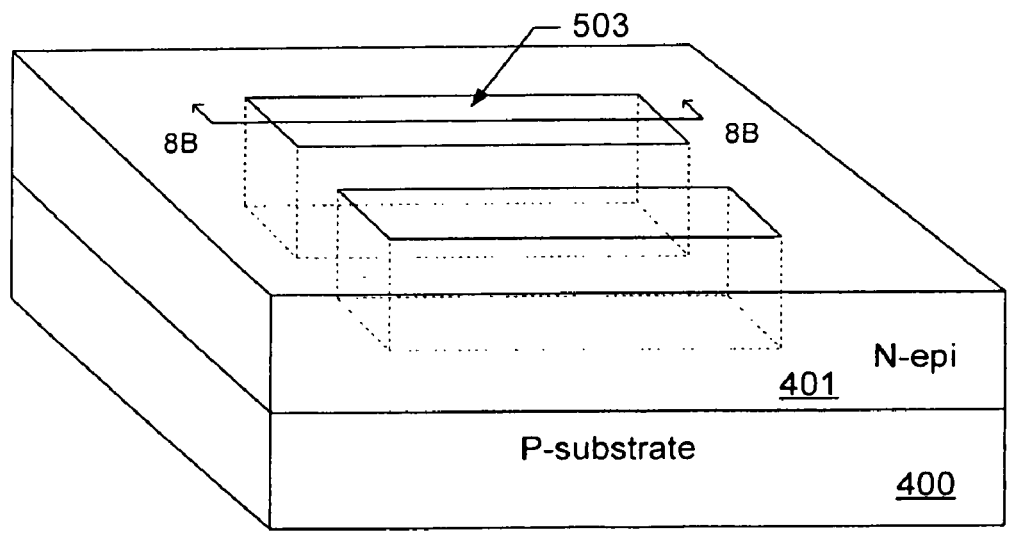

FIGS. 8A-8F illustrate a process that can be used to form JFET regions 416. The process starts with N-epi layer 401 that is grown on P-substrate 400, as shown in FIG. 8A. A photoresist layer 501 is formed on top of N-epi layer 401 and patterned to have an opening that corresponds with the shape and location of the JFET region 416 that is to be formed. In MOSFET 40 shown in FIG. 4, for example, the opening in photoresist layer 501 would be rectangular. The structure is then subjected to a reactive ion etch (RIE). This is a highly directional process that etches a trench 503, as shown in FIG. 8B. FIG. 8C shows a perspective view of trench 503. The section line 8B-8B indicates the section at which the view of FIG. 8B is taken.

Figure 8D:
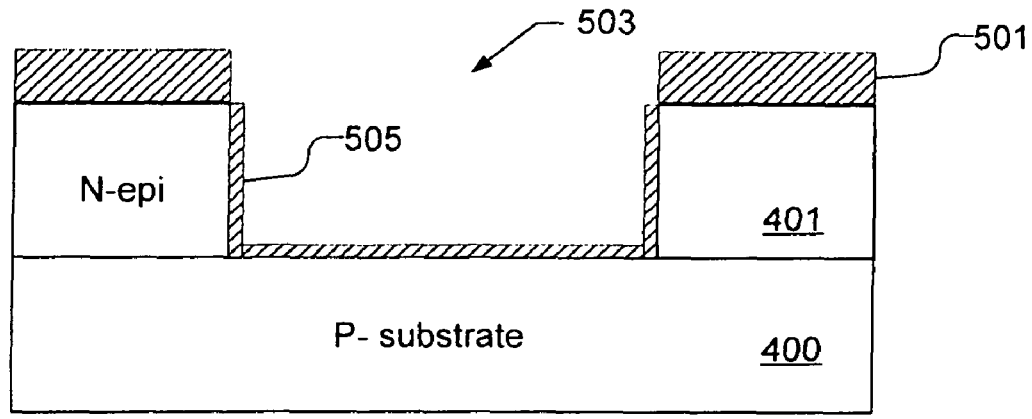

Next, as shown in FIG. 8D, the structure is subjected to a thermal process, which forms an oxide layer 505 on the walls and floor of the trench 503. Oxide layer 505 may be formed by heating the structure to 1050° C. for 30 minutes, for example. Photoresist layer 501 prevents the oxide layer from forming on the top surface of N-epi layer 401. After oxide layer 505 has been formed, photoresist layer 501 is removed.

Figure 8E:
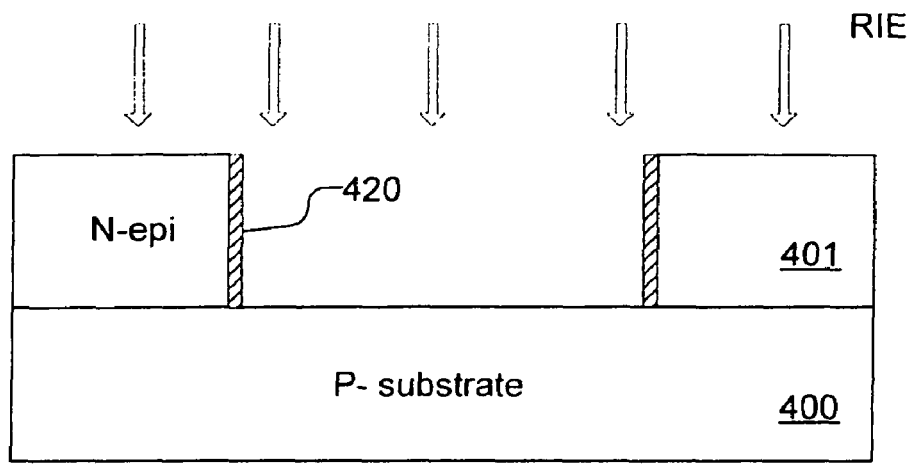

The structure subjected to a second RIE process. Again, this is a highly directional process that when directed vertically downward removes the portion of oxide layer 505 from the floor of trench 503, while leaving the portion of oxide layer 505 on the walls of trench 503. This remaining portion of oxide layer 505 becomes the oxide layer 420 that lines the walls of JFET regions 416. The result is shown in FIG. 8E.

Figure 8F:
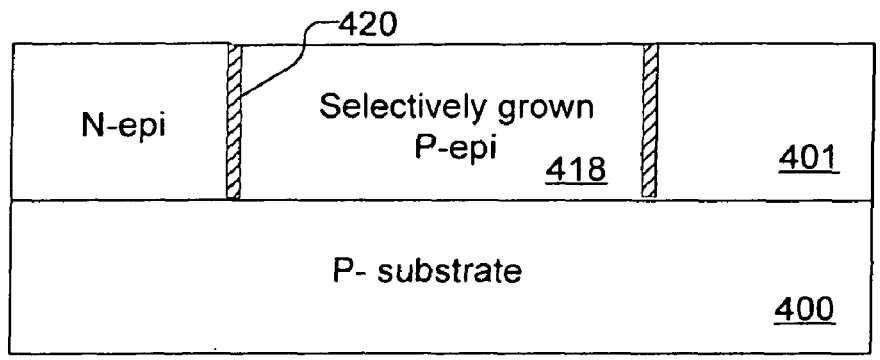

As shown in FIG. 8F, trench 503 is filled with a selectively-grown P-epi layer 418. Selective epi growth processes are well known in the art and rely on the phenomenon that under certain conditions an epitaxial layer grows on single crystal silicon, and not on silicon dioxide.

After JFET regions 416 have been formed, as described in FIGS. 8A-8F, conventional processes can be used to form the remaining junctions of MOSFET 40. For example, N+ drain region 402 is implanted, and field oxide layer 414 is grown by a LOCOS process. A gate oxide layer is formed. A polysilicon layer is deposited and patterned to form gate 406 on top of the gate oxide layer. P body region 412 and N+ source region 408 are implanted and diffused, using gate 406 as a mask, in a conventional double-diffusion process that forms channel region 417 underneath gate 406. P+ body contact region 410 is implanted. The metal layers for the source, gate and drain contacts are then deposited and patterned. The result is MOSFET 40 shown in FIGS. 4, 5A and 5B. Note that the JFET regions 416 do not have to be masked during the remaining process steps that are required to form MOSFET 40.

The MOSFET can be formed in a wide variety of geometric shapes. It will be apparent from FIG. 4 that the MOSFET could easily be formed in a "stripe" configuration, with longitudinal source and drain regions that are parallel to each other.

Figure 9:
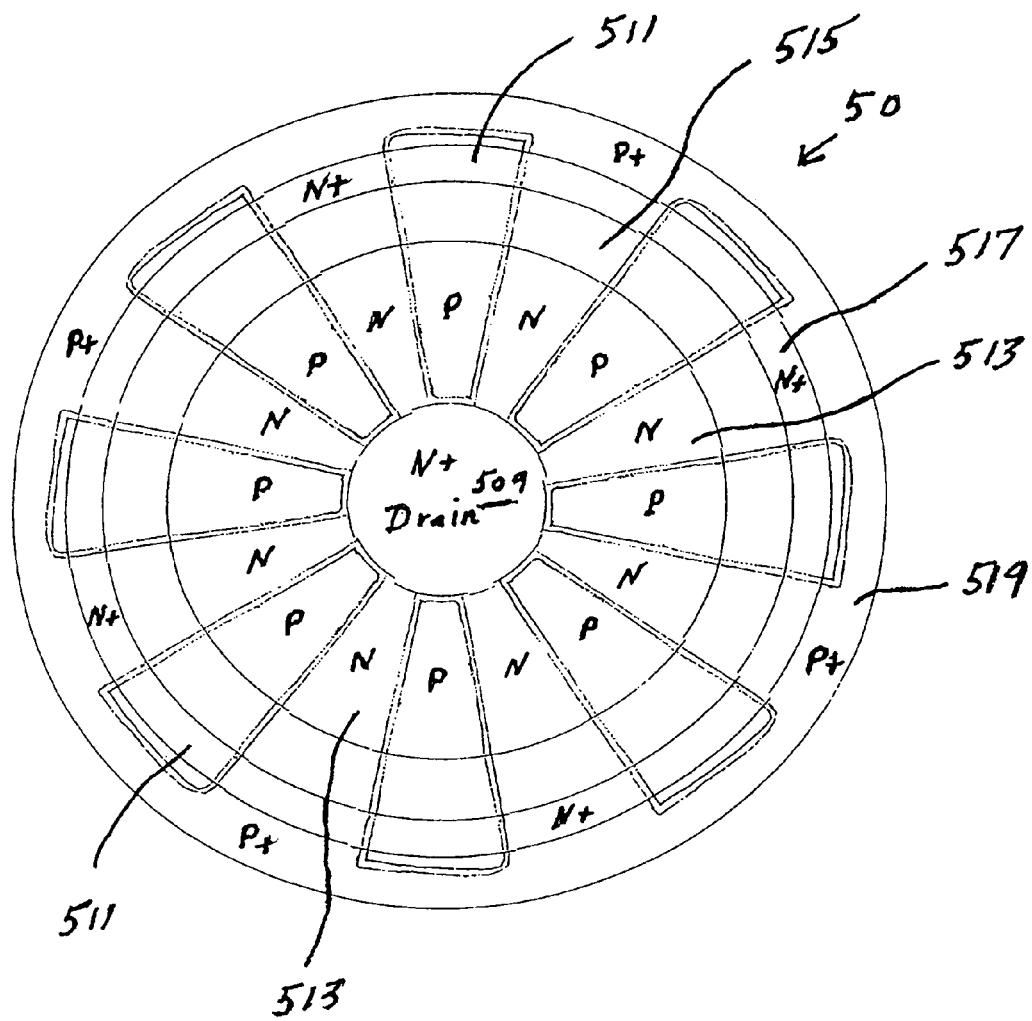
FIG. 9 is a top view of a circular MOSFET in accordance with the invention.

FIG. 9 shows a top view of a MOSFET 50 that is in a circular configuration, with N+ drain region 509 being at the center of the device and pie-shaped JFET regions 511 extending radially outward from N+ drain region 509. Also shown are a drift region 513, a gate 515, an N+ source region 517 and a P body contact region 519.

In the embodiments described thus far, each JFET region extends downward from the surface of the epitaxial layer to the interface between the epitaxial layer and the substrate. The JFET regions are laterally spaced from each other and are separated by intervening portions of the drift region in an "interdigitated" arrangement.

The broad principles of this invention are not limited to MOSFETs but may be used in a wide variety of semiconductor devices.

Figure 10A:
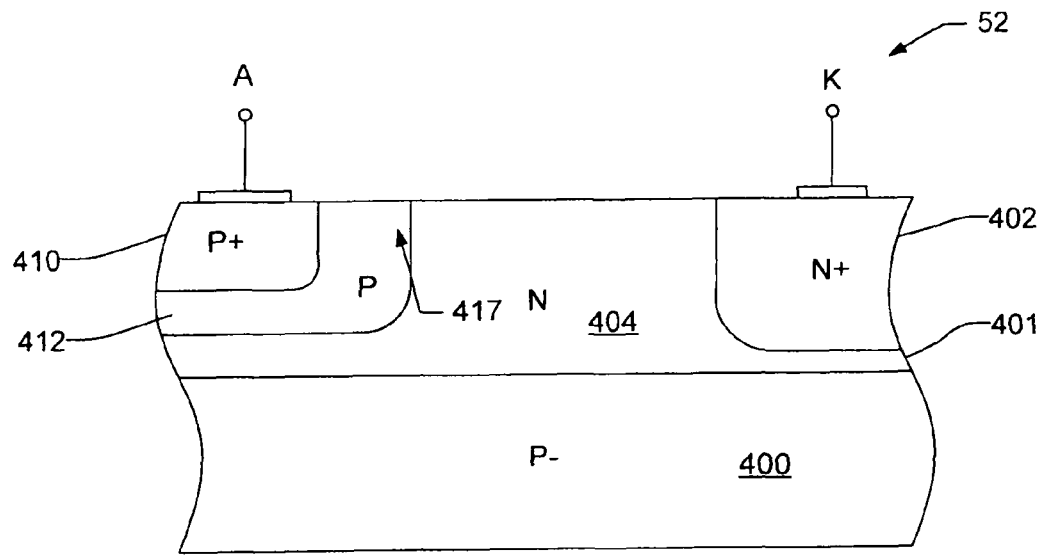
FIGS. 10A and 10B are cross-sectional views of a diode in accordance with the invention.
Figure 10B:
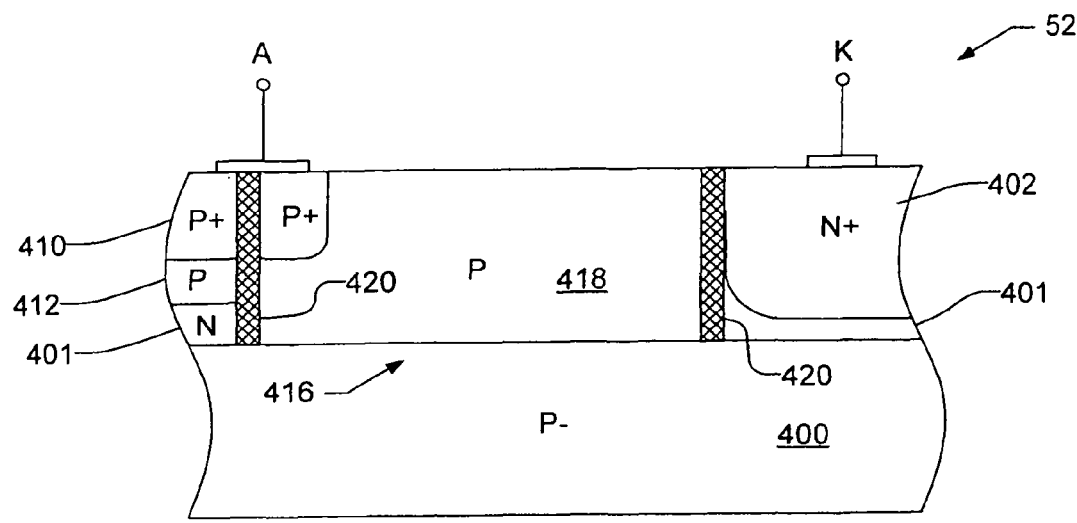

FIGS. 10A and 10B are cross-sectional views of a diode 52 having a drift region constructed in accordance with this invention. FIG. 10A is a cross section taken through a portion of the drift region 404 between the JFET regions 416; FIG. 10B is a cross section taken through one of the JFET regions 416. P region 412 and P+ region 410 together form the anode of diode 52; N+ region 402 and N drift region 404 together form the cathode of diode 52. When diode 52 is reverse-biased, the JFET regions 416 pinch off the current through the drift region 404, improving the voltage-blocking ability of diode 52.

Figure 11A:
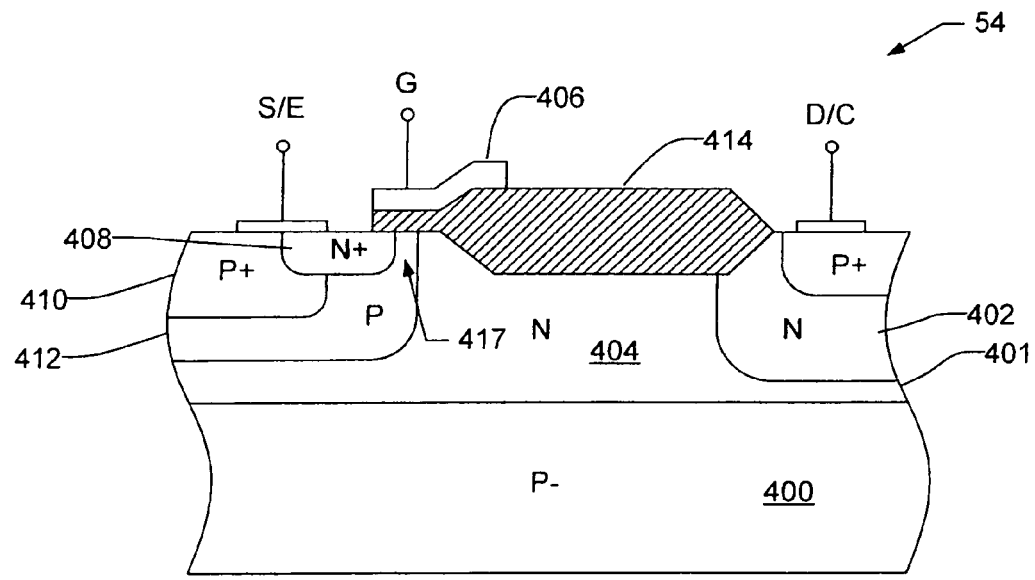
FIGS. 11A and 11B are cross-sectional views of an insulated gate bipolar transistor (IGBT) in accordance with the invention.
Figure 11B:
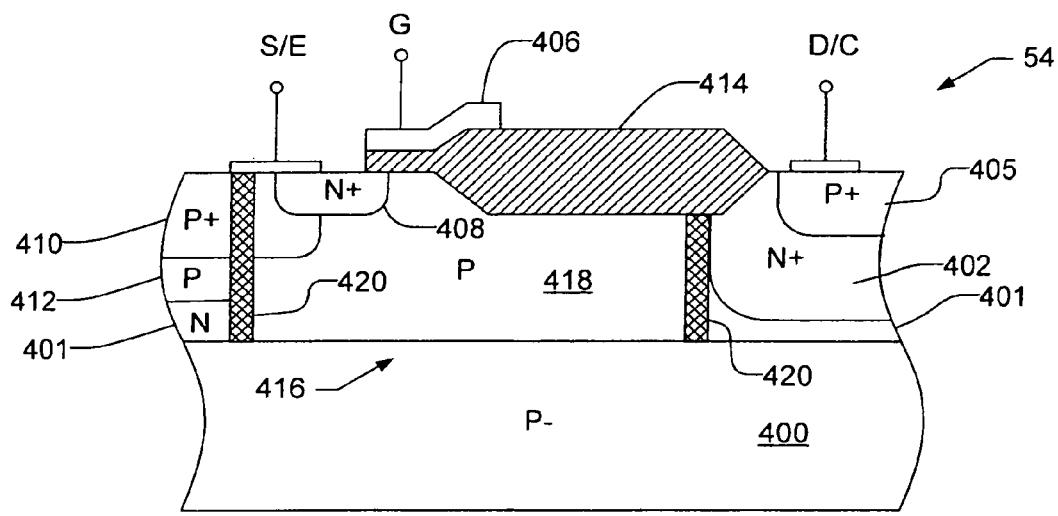

FIGS. 11A and 11B are cross-section views of an IGBT 54 having a drift region constructed in accordance with this invention. IGBT 54 includes a P+ region 405 that is connected to the drain/collector terminal of IGBT 54. The source/emitter terminal of IGBT 54 is connected to N+ region 408. FIG. 11A is a cross section taken through a portion of the drift region 404 between the JFET regions 416; FIG. 11B is a cross section taken through one of the JFET regions 416. When IGBT 54 is turned off, the JFET regions 416 pinch off the current through the drift region 404, improving the voltage-blocking ability of IGBT 54.

Figure 12:
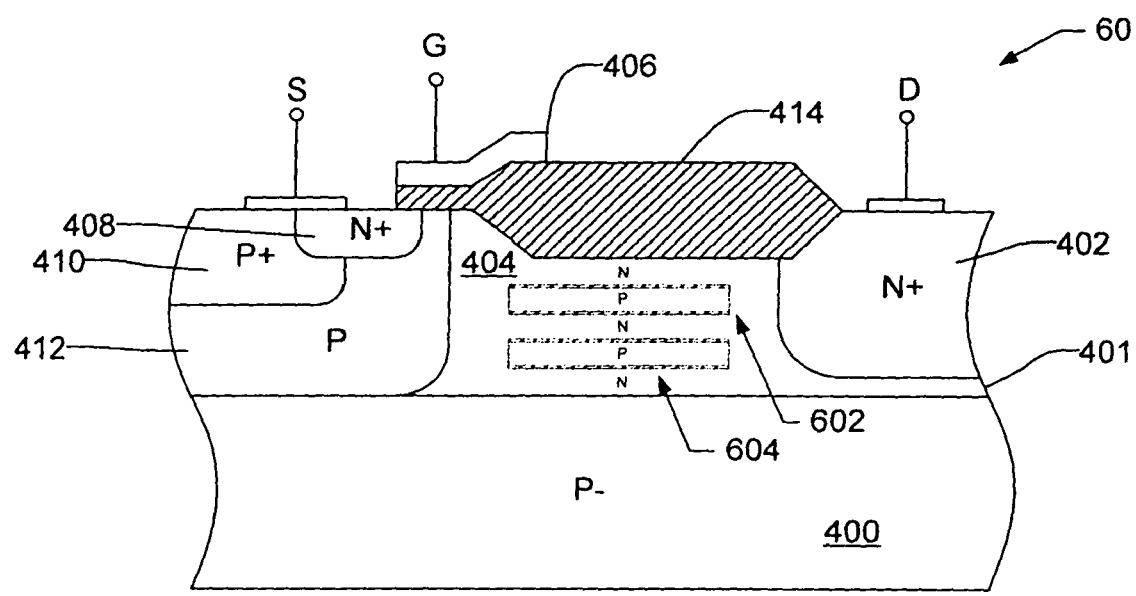
FIG. 12 is a cross-sectional view of a MOSFET in accordance with an alternative embodiment of the invention wherein the JFET regions are vertically stacked.
Figure 13:
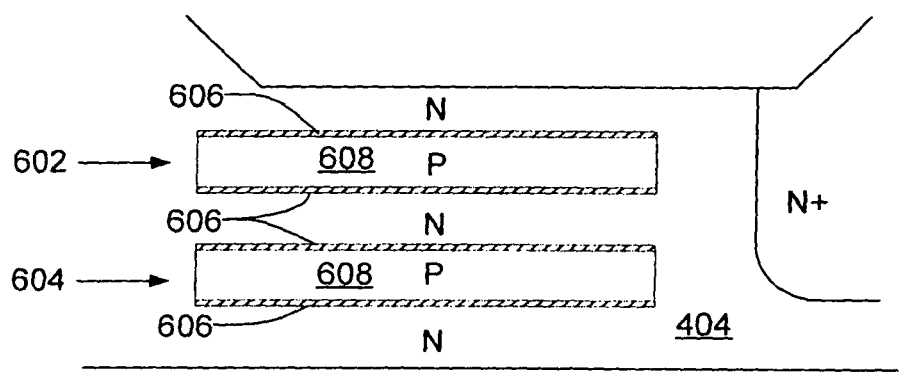
FIG. 13 is a detailed view of the JFET regions in the embodiment of FIG. 12.
Figure 14:
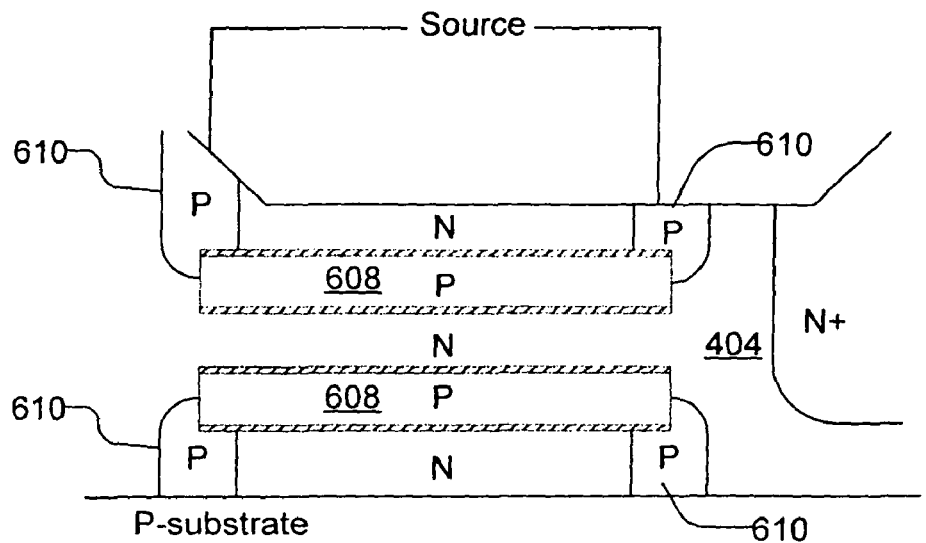
FIG. 14 is a view of possible external connections in the embodiment of FIG. 12.

In another group of embodiments, the JFET regions are vertically arranged in a stack, with an oxide layer on the ceiling and floor of each JFET region. FIG. 12 shows a MOSFET 60 with JFET regions 602 and 604 arranged in vertical stack in the drift region 404. As shown in the detailed view of FIG. 13, each of JFET regions 602 and 604 is filled with P epi material 608, and the floor and ceiling of each of JFET regions 602 and 604 is covered with an oxide layer 606. As shown in FIG. 14, JFET regions 602 and 604 can be electrically connected to the P substrate and source terminal (both of which are normally grounded) by means of P sinkers 610.

Figure 15:
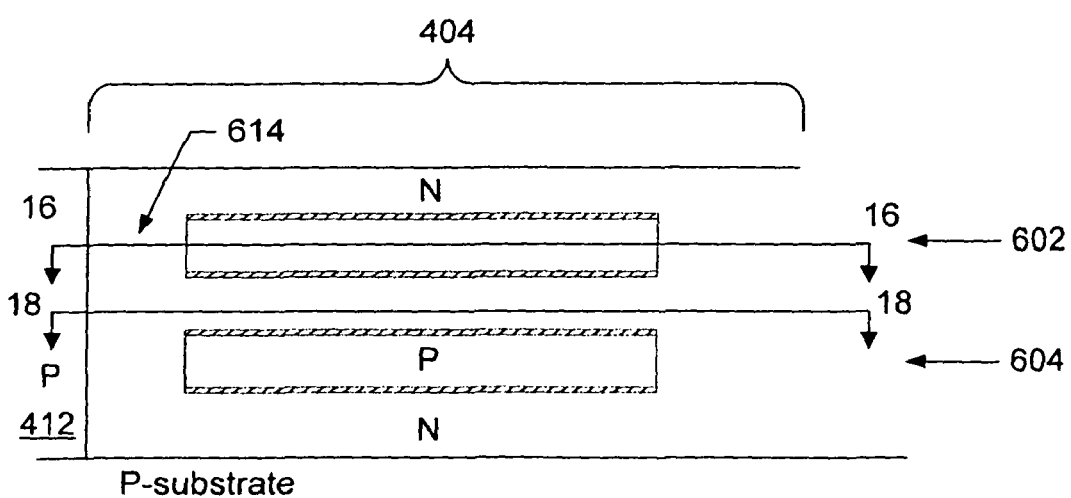
FIG. 15 is a detailed cross-sectional view of the drift region in an embodiment wherein the JFET regions are vertically stacked, taken at section 15-15 in FIG. 16.
Figure 16:
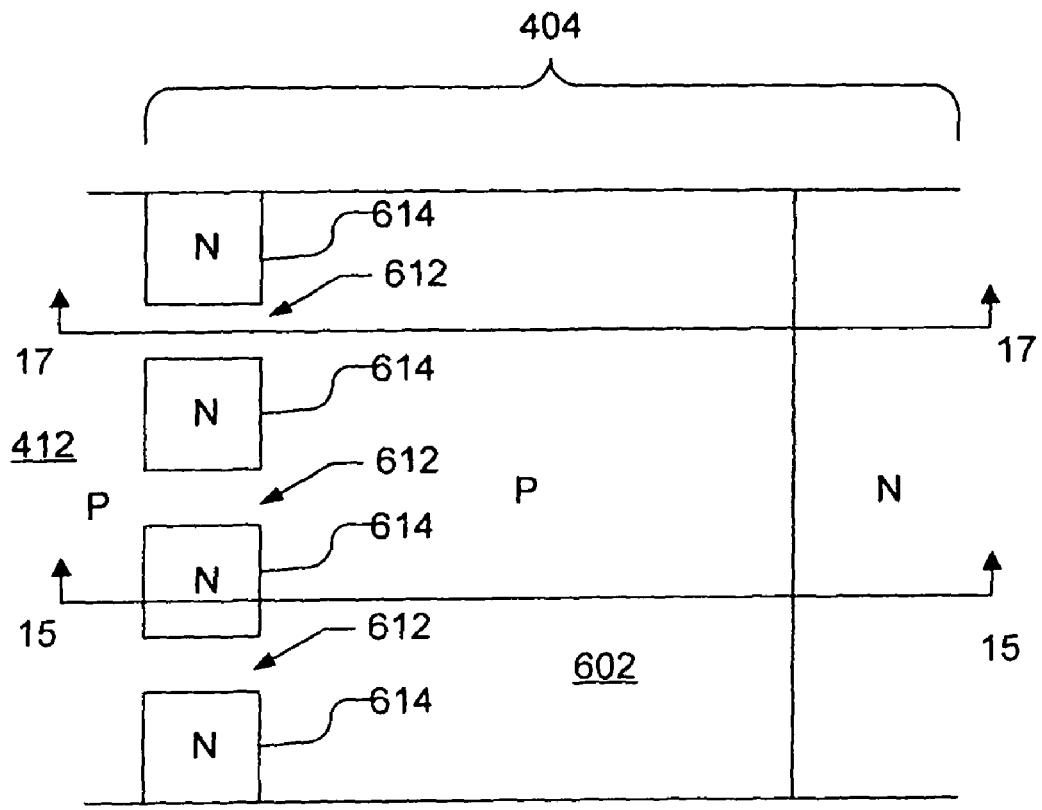
FIG. 16 is a top view of a JFET region taken at section 16-16 in FIG. 15.

FIGS. 15-19 illustrate in more detail the structure of the drift region in accordance with this aspect of the invention. FIG. 15 is similar to FIG. 13 and shows JFET region 602 overlying and spaced apart from JFET region 604 in N drift region 404. FIG. 16 is a top view of JFET region 602 taken at section 16-16 in FIG. 15. JFET region 604 includes a series of fingers 612 that connect the main body of JFET region 604 with P region 412. Fingers 612 are separated by windows 614 which are part of N drift 404. Windows 614 provide an electrical connection between the layers of N drift region 404 on the left side of JFET regions 602 and 604.

Figure 17:
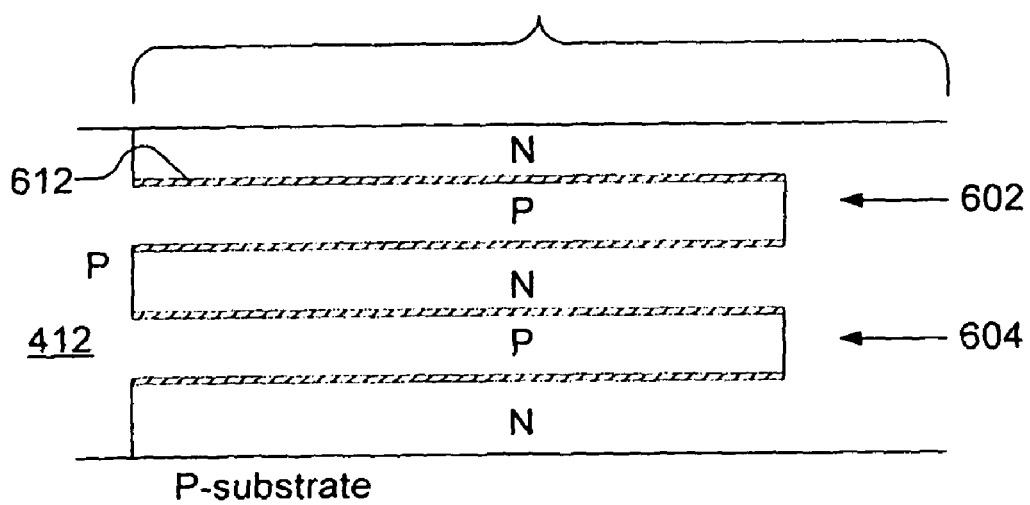
FIG. 17 is a detailed cross-sectional view taken at section 17-17 in FIG. 16.
Figure 18:
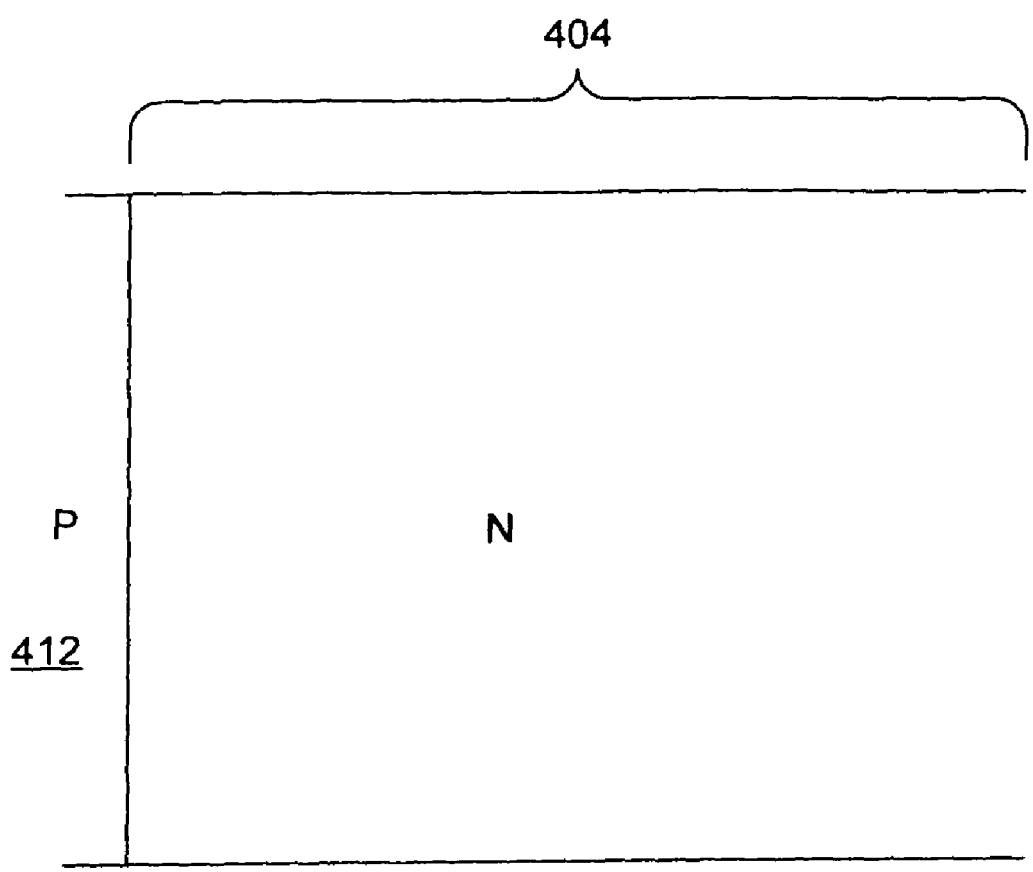
FIG. 18 is a top view of a region between the JFET regions, taken at section 18-18 in FIG. 15.

FIG. 17 is a cross-sectional view taken at section 17-17 in FIG. 16 through one of fingers 612. FIG. 18 is a top view taken at section 18-18 in FIG. 15.

Figure 19A:
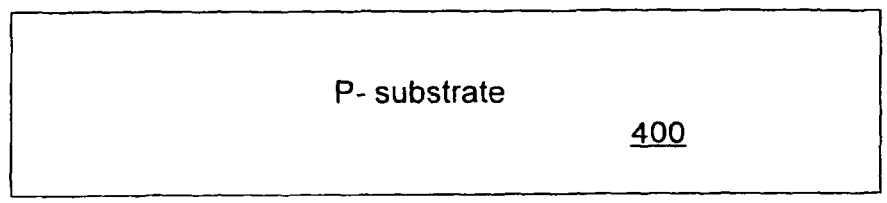
FIGS. 19A-19P illustrate a process of fabricating the drift region of the MOSFET of FIG. 12.
Figure 19B:
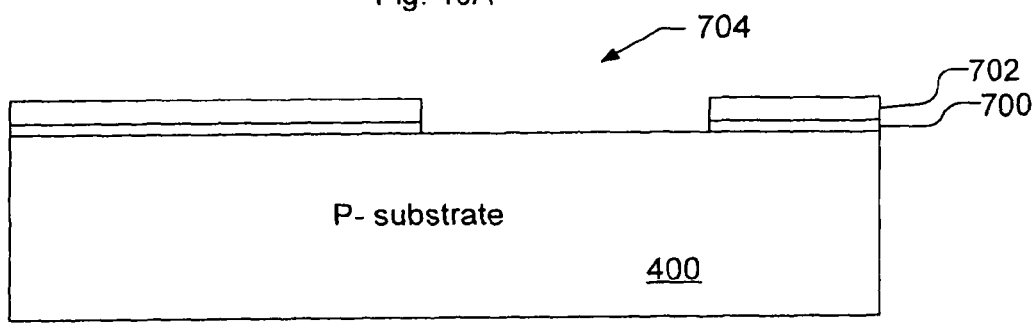
Figure 19C:
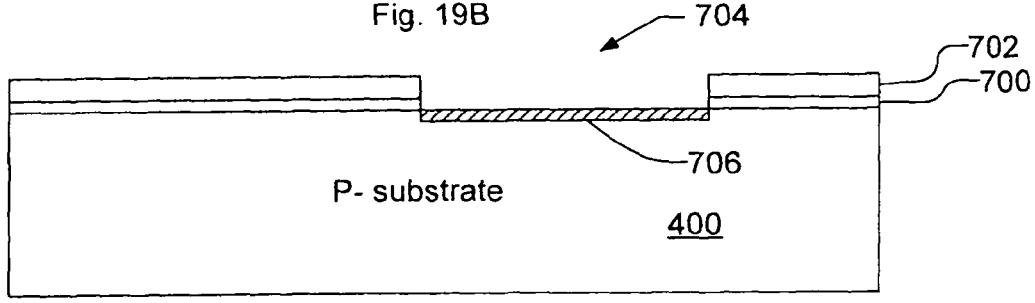
Figure 19D:
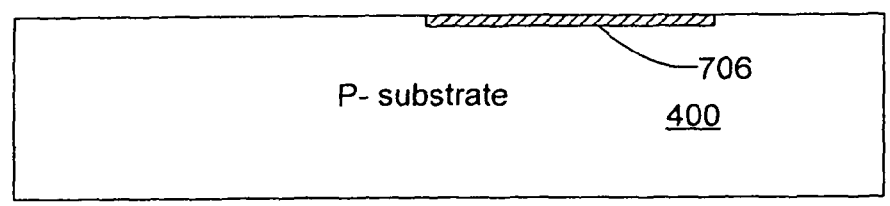
Figure 19E:
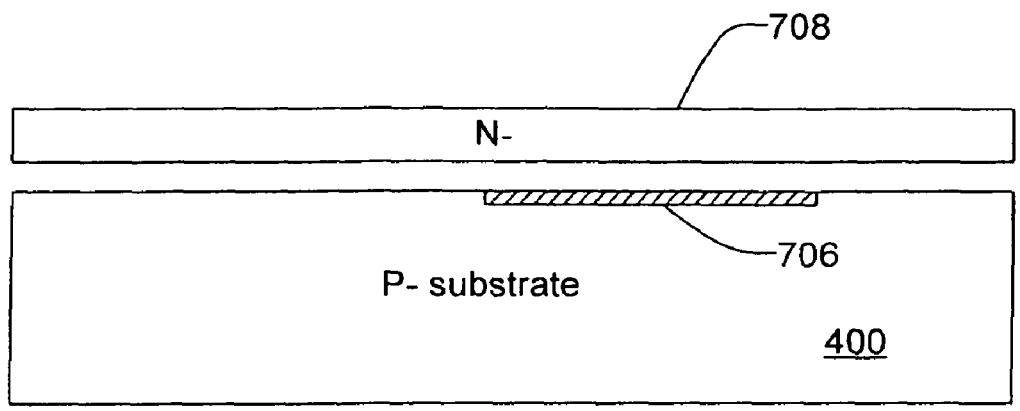
Figure 19F:
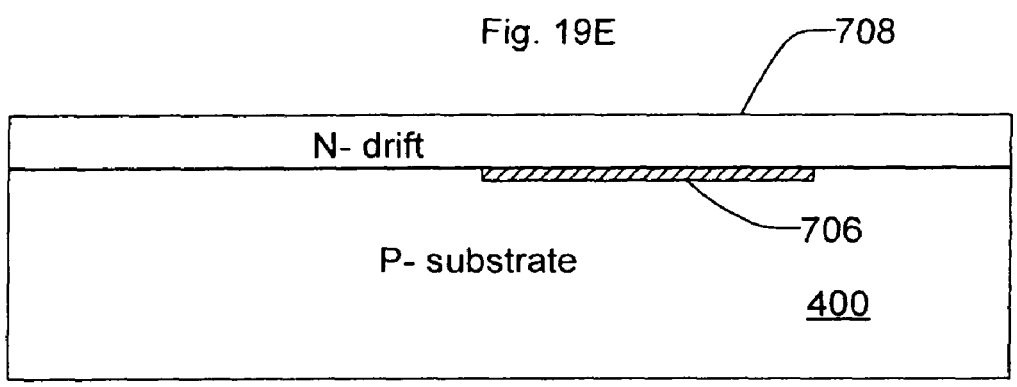
Figure 19G:
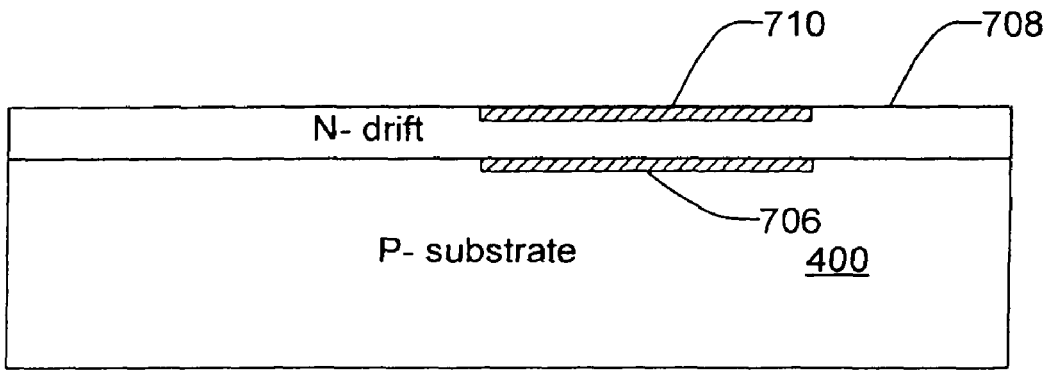
Figure 19H:
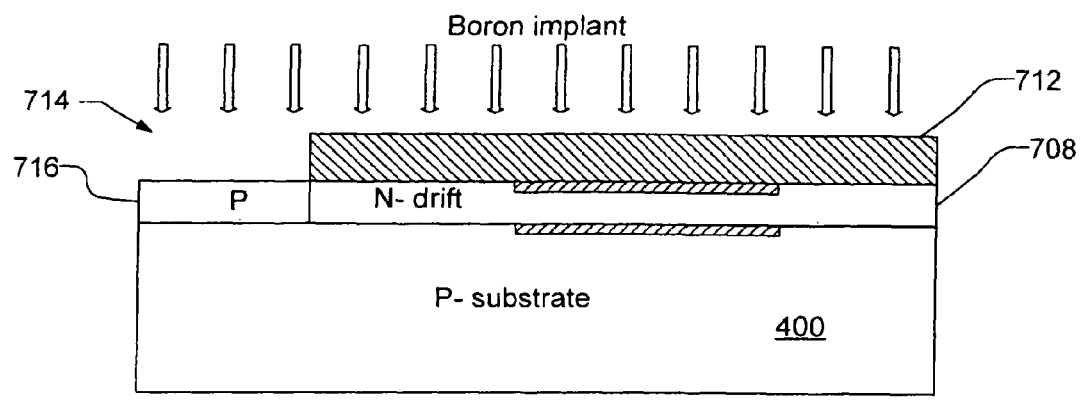
Figure 19I:
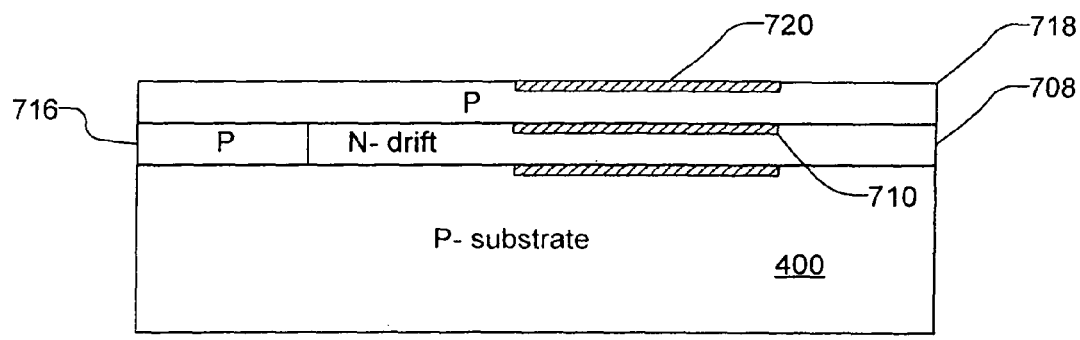
Figure 19J:
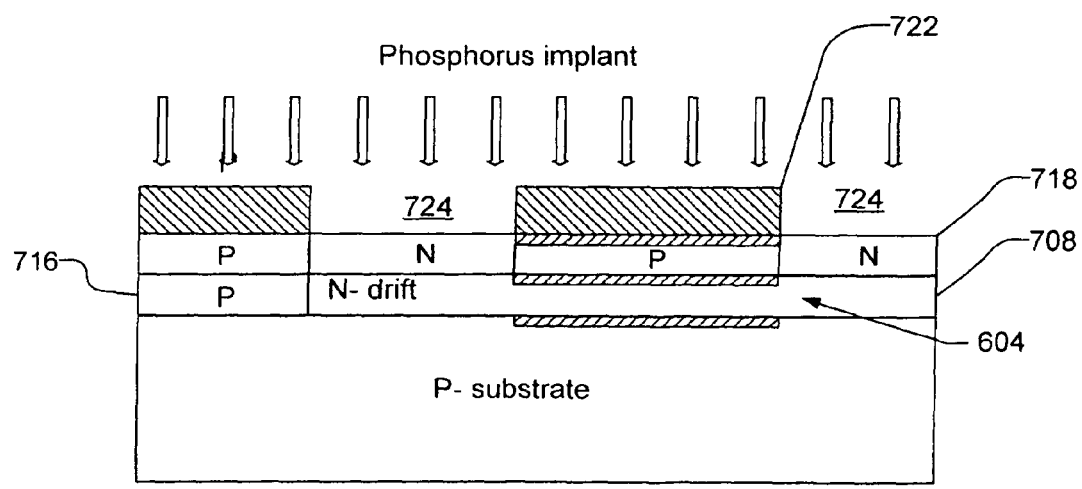
Figure 19K:
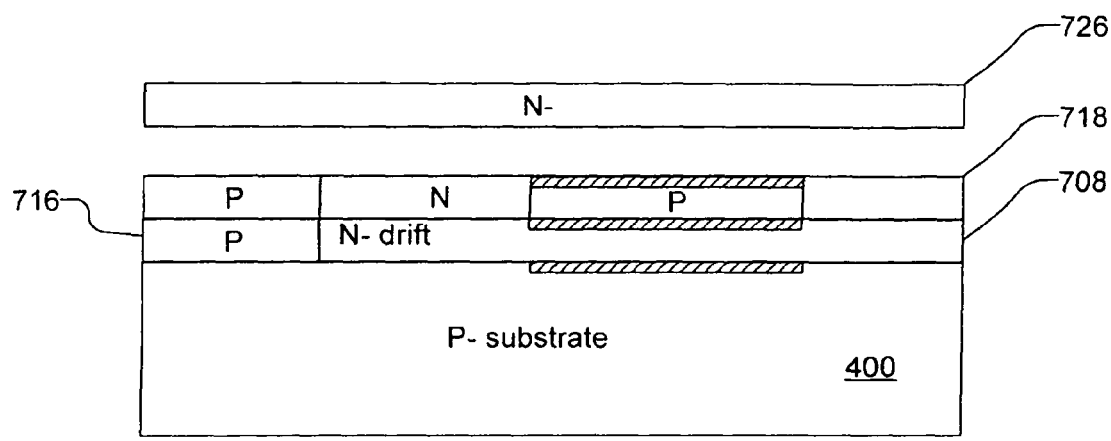
Figure 19L:
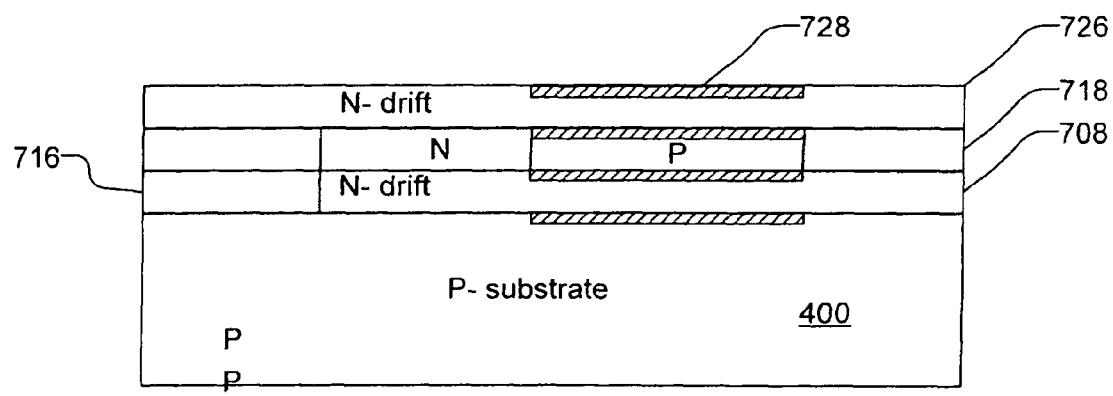
Figure 19M:
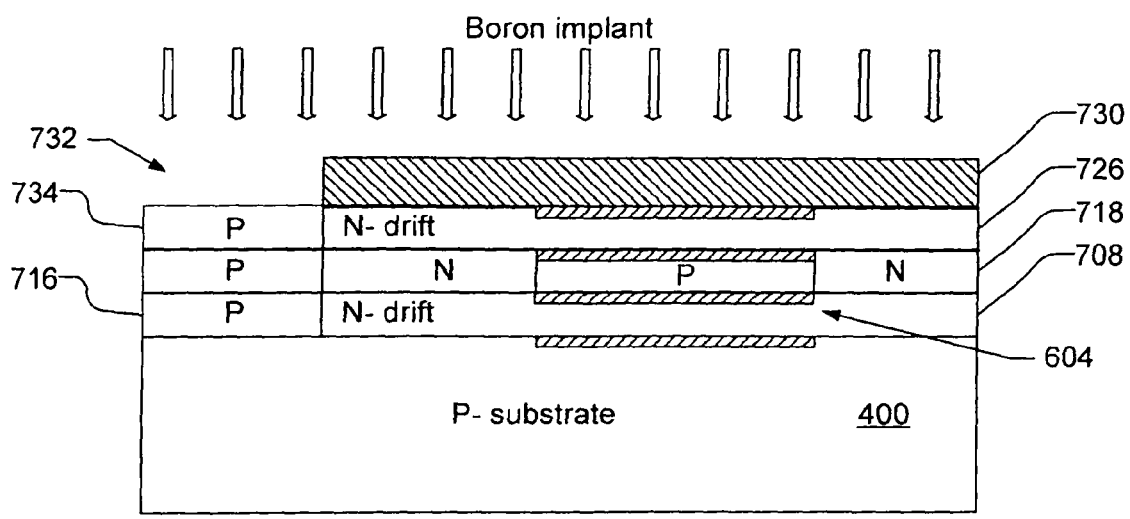
Figure 19N:
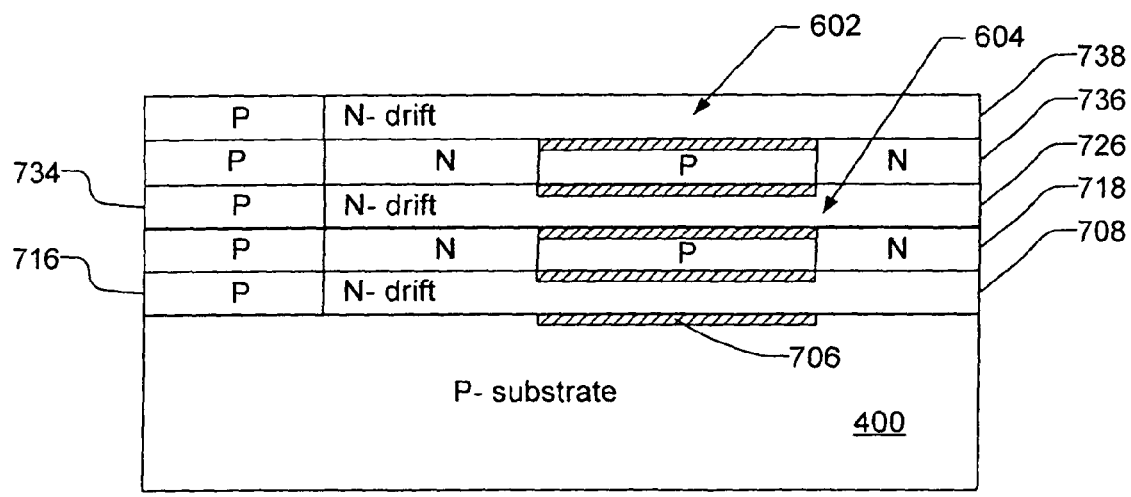
Figure 19O:
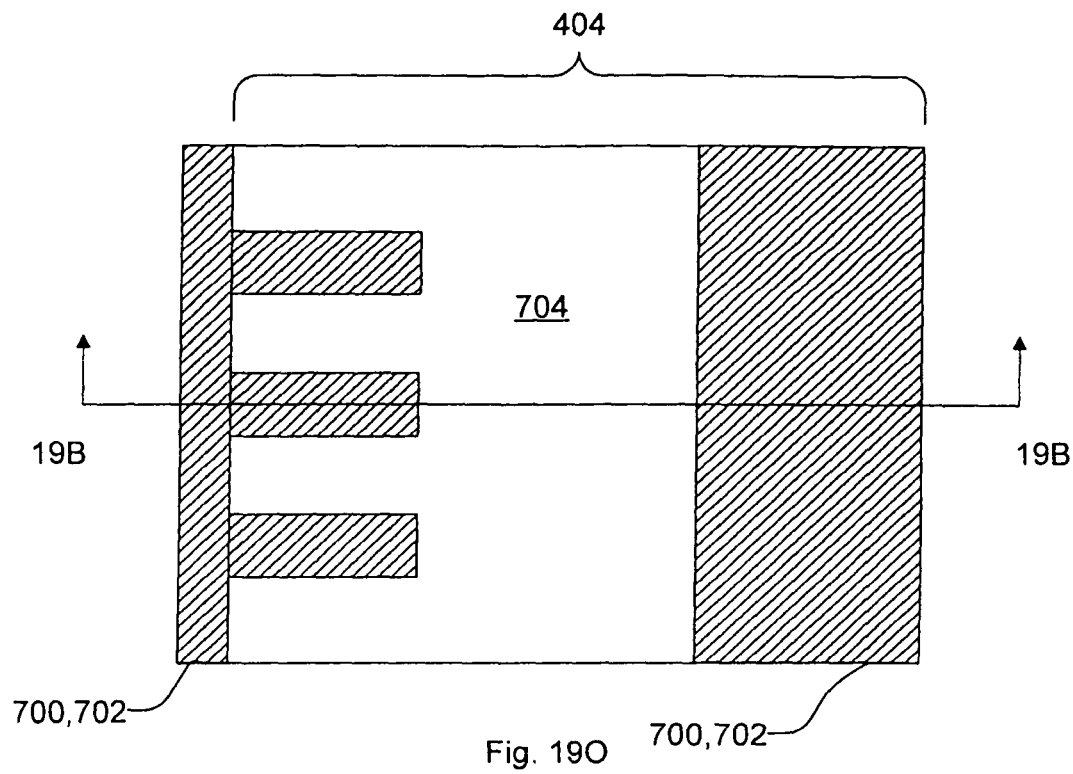
Figure 19P:
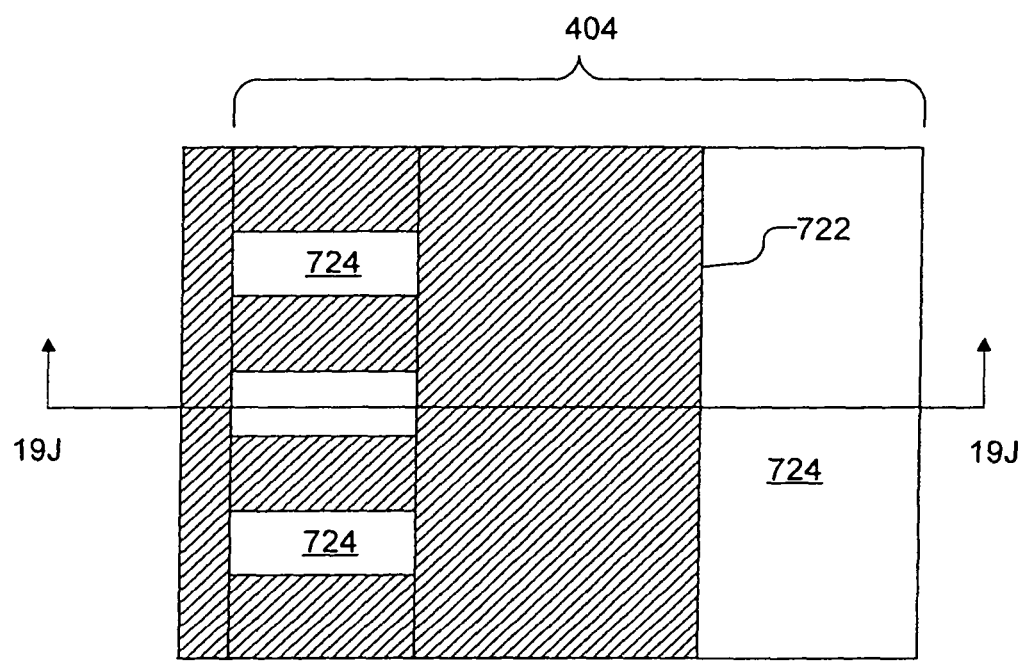

FIGS. 19A-19P illustrate a process of fabricating a drift region of this embodiment.

The process begins with P-substrate 400, as shown in FIG. 19A. A thin oxide layer 700 is thermally grown in P-substrate 400, and a nitride layer 702 is deposited on top of oxide layer 700. Oxide layer 700 could be 200-300 Å thick and nitride layer 702 could be 1000 Å thick. Oxide layer 700 and nitride layer 702 are then patterned, using conventional photolithographic processes, to form an opening 704, exposing the top surface of P-substrate 400, as shown in FIG. 19B. Oxide layer 700, nitride layer 702 and opening 704, viewed from above, are in the form shown in FIG. 19O, with FIG. 19B being taken at cross-section 19B-19B.

As shown in FIG. 19C, an oxide layer 706 (e.g., 2500 Å thick) is thermally grown on the top surface of P-substrate 400 in opening 704. Oxide layer 700 and nitride layer 702 are removed and then the wafer surface is planarized using a chemical mechanical polishing (CMP) process, yielding the structure shown in FIG. 19D.

Next, as shown in FIGS. 19E and 19F, a thin N-wafer 708 is introduced and bonded to the top surface of P-substrate 400, covering oxide layer 706. N-wafer 708 could have a doping concentration of $2 \times 10^{16}$ cm$^{-3}$ and could be 2 µm thick, for example. Wafer bonding techniques are well known and are described in, for example, U.S. Pat. Nos. 5,769,991 to Miyazawa et al, 5,849,627 to Linn et al., 6,630,713 to Guesic, and 6,563,133 to Tong, and references cited therein.

An oxide layer and a nitride layer similar to oxide layer 700 and nitride layer 702 are formed on the top surface of N-wafer 708 and are patterned to have an opening similar to opening 704, shown in FIGS. 19B and 19O. The oxide layer and nitride layer are in the shape of oxide layer 700 and nitride layer 702, as shown in FIG. 19O. The top surface of N-wafer 708 is then heated to form an oxide layer 710, which overlies and is essentially the same shape as oxide layer 706. The oxide and nitride layers are removed and planarized using CMP, yielding the structure shown in FIG. 19G.

As shown in FIG. 19H, a photoresist layer 712 is formed on the top surface of N-wafer 708. Photoresist layer 712 is patterned to form an opening 714, and boron is implanted from above, forming a P region 716 under opening 714. The portion of N-wafer underlying photoresist layer 712 becomes a part of drift region 404. Photoresist layer 712 is removed.

A thin P-wafer 718 is introduced and bonded to the top surface of N-wafer 708. P-wafer 718 could have a doping concentration of $2 \times 10^{16}$ cm$^{-3}$ and a thickness of 2 µm, for example. An oxide layer and a nitride layer similar to oxide layer 700 and nitride layer 702 are formed on the top surface of P-wafer 718 and are patterned to have an opening similar to opening 704, shown in FIGS. 19B and 19O. The oxide layer and nitride layer are in the shape of oxide layer 700 and nitride layer 702, as shown in FIG. 19O. P-wafer 718 is then heated to form an oxide layer 720, and the oxide and nitride layers are removed and planarized using CMP. Oxide layer 720 is laterally coextensive with oxide layer 710. The resulting structure is shown in FIG. 19I.

A photoresist layer 722 is deposited on the top surface of P-wafer 718. Photoresist layer 722 is patterned to form openings 724, as shown in FIG. 19J. The shape of photoresist layer 722 and openings 724 are shown in FIG. 19P, with FIG. 19J being taken at cross-section 19J-19J. Phosphorus is implanted from above into openings 724, leaving the portions of P-wafer 718 underneath photoresist layer 722 with P-type conductivity. The portions of P-wafer 718 underneath openings 724 are converted to N-type conductivity, as shown in FIG. 19J. Photoresist layer 722 is removed, completing the fabrication of JFET region 604.

From a comparison of FIGS. 19O and 19P, it will be noted that, within drift region 404, the coverage of the oxide and nitride mask layers 700 and 702 is complementary to the coverage of photoresist layer 722; and the lateral extent of opening 704 is complementary to the lateral extent of openings 724. In other words, within drift region 404 the coverage of oxide and nitride mask layers 700 and 702 is substantially the same as the lateral extent of openings 724; and the coverage of photoresist layer 722 is substantially the same as the lateral extent of opening 704. This assures that the oxide layers 710 and 720 will be on the floor and ceiling, respectively, of JFET region 604, and similarly that the other oxide layers will be on the floor and ceiling of their corresponding JFET region.

As shown in FIGS. 19K and 19L, an N-wafer 726 is introduced and bonded to the top surface of P-wafer 718. Oxide and nitride layers similar to oxide layer 700 and nitride layer 702 are deposited on the top surface of N-wafer 726 and are patterned to form openings similar to openings 704, as shown in FIG. 19O. N-wafer 726 is heated to form an oxide layer 728, which overlies oxide layers 706, 710 and 720. The oxide and nitride mask layers are removed, leaving the structure shown in FIG. 19L.

As shown in FIG. 19M, a photoresist layer 730 is deposited on the top surface of N-wafer 726 and is patterned to form an opening 732. Boron is implanted through opening 732 to form a P region 734. Photoresist layer 730 is then removed.

A thin P-wafer 736 is bonded to the top surface of N-wafer 726 and then processed in the same manner as P-wafer 718 to form JFET region 602. A thin N-wafer 738 is bonded to the top surface of P-wafer 736 and processed in the same manner as N-wafers 708 and 726. The resulting structure is shown in FIG. 19N, with JFET regions 602 and 604 being formed in P-wafers 736 and 718, respectively. A drift region with more than two JFET regions can be formed by adding more layers to the structure and processing them as described above. In some embodiments oxide layer 706 can be omitted. In some embodiments dielectric layers composed of nitride or other insulating materials can be used in place of the oxide layers on the floors and ceilings of the JFET regions.

Preferably, the charge in the lower half of each of the JFET regions should balance the charge in the upper half of the underlying portion of the N-type drift region (except in the case of the lowest JFET, where the charge in the lower half of that JFET region should balance the charge in the entire underlying portion of the N-type drift region); and the charge in the upper half of each of the JFET regions should balance the charge in the lower half of the overlying portion of the N-type drift region (except in the case of the uppermost JFET region, where the charge in the upper half of that JFET region should balance the charge in the entire overlying portion of the N-type drift region).

Figure 20:
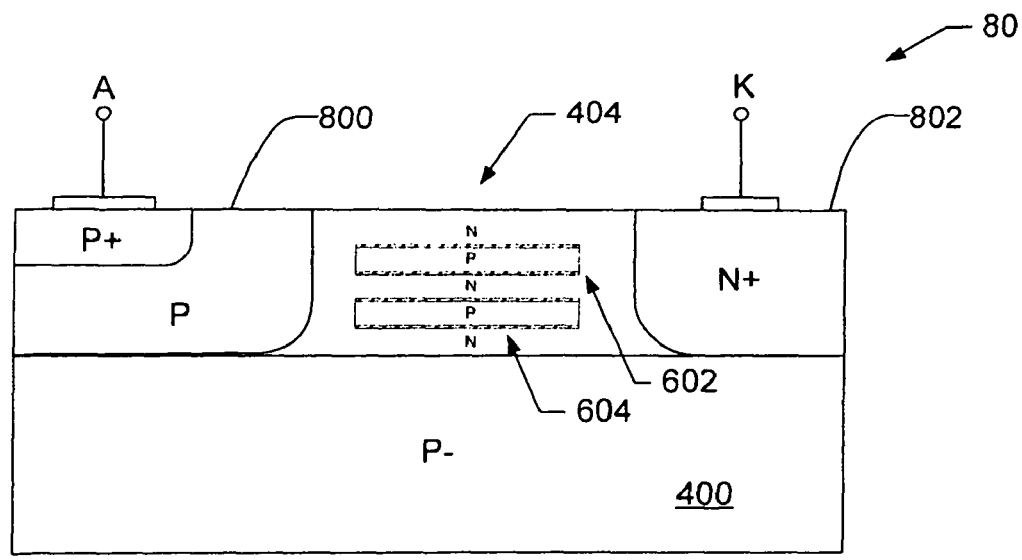
FIG. 20 is a cross-sectional view of a diode containing a drift region with vertically stacked JFET regions.
Figure 21:
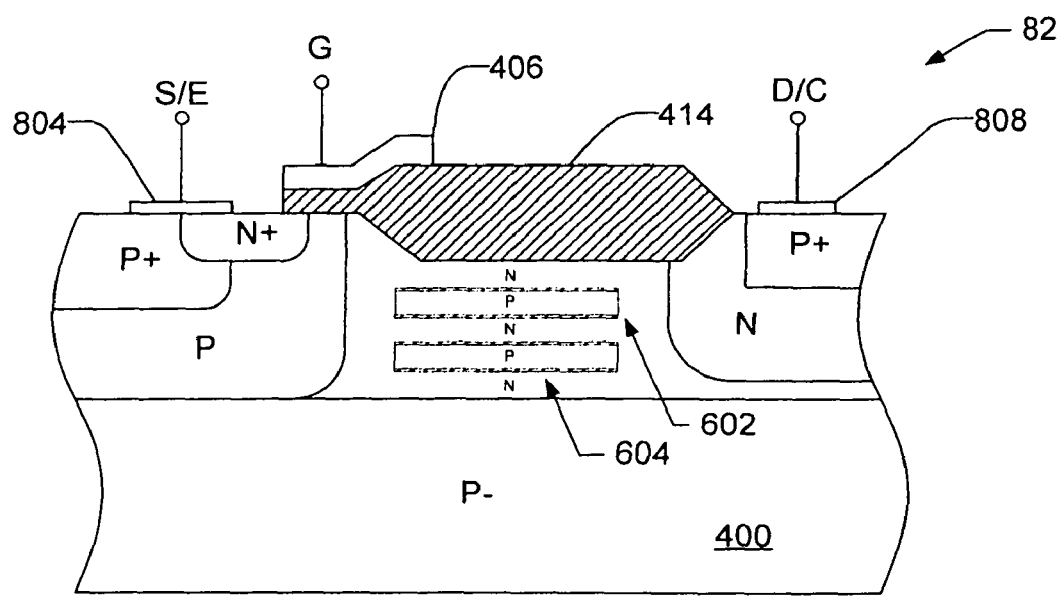
FIG. 21 is a cross-sectional view of an IGBT containing a drift region with vertically stacked JFET regions.

A drift region according to this invention can be used in a wide variety of semiconductor devices. Two examples are illustrated in FIGS. 20 and 21. FIG. 20 is a cross-sectional view of a diode 80 having an anode 800 and a cathode 802 and containing a drift region 404 with vertically stacked JFET regions 602 and 604. FIG. 21 is a cross-sectional view of an IGBT 82 having a source/emitter terminal 804, a gate terminal 806, and a drain/collector terminal 808. IGBT contains a drift region 404 with vertically stacked JFET regions 602 and 604.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

I claim:

1. A semiconductor device comprising:
    a terminal region of a first conductivity type;
    a drift region of the first conductivity type abutting the terminal region, an average doping concentration of the drift region being lower than an average doping concentration of the terminal region; and
    at least one JFET region of a second conductivity type opposite to the first conductivity type embedded within the drift region, the at least one JFET region having a floor and a ceiling, each of the floor and ceiling of the at least one JFET region being lined with a layer of a dielectric material.

2. The semiconductor device of claim 1 wherein the floor and ceiling of the JFET region are parallel and are separated by walls, the walls being defined by a PN junction.

3. The semiconductor device of claim 1 comprising a stack of at least two of the JFET regions.

4. The semiconductor device of claim 3 wherein the at least two JFET regions are of the same size and shape and are located one directly above another, the at least two JFET regions being separated by at least one intervening layer of the drift region.

5. The semiconductor device of claim 4 wherein a quantity of charge in a bottom half of a top one of the JFET regions balances a quantity of charge in a portion of the top half of an intervening layer of the drift region directly below the top one of the JFET regions.

6. The semiconductor device of claim 4 wherein a top one of the JFET regions is overlain by a top layer of the drift region and a bottom one of the JFET regions is underlain by a bottom layer of the drift region.

7. The semiconductor device of claim 6 wherein the drift region lies atop a substrate of the second conductivity type, the device further comprising a first sinker region of the second conductivity type extending between the bottom one of the JFET regions and the substrate.

8. The semiconductor device of claim 7 comprising a second sinker region extending between the top one of the JFET regions and a top surface of the drift region.

9. The semiconductor device of claim 6 wherein the drift region is bordered laterally by a second region of the second conductivity type, each of the JFET regions abutting the second region.

10. The semiconductor device of claim 9 wherein each of the at least two JFET regions comprises a plurality of fingers separated laterally by intervening portions of the drift region, the fingers extending between a main portion of each JFET region and the second region.

11. The semiconductor device of claim 9 wherein said device comprises a MOSFET, the terminal region comprising a drain region, the second region comprising a body region, the device further comprising a source region of the first conductivity type in contact with the body region.

12. The semiconductor device of claim 9 wherein said device comprises a diode, the terminal region comprising a cathode region, the second region comprising an anode region.

13. The semiconductor device of claim 9 wherein said device comprises an insulated gate bipolar transistor, the terminal region comprising a drain region, the second region comprising a body/emitter region, the device further comprising a source region of the first conductivity type in contact with the body/emitter region and a collector region of the second conductivity type abutting the drain region.

14. A method of fabricating a semiconductor device comprising a drift region and at least one JFET region embedded in the drift region, the drift region being of a first conductivity type and being in contact with a first terminal region of the first conductivity type, the method comprising:
    providing a semiconductor substrate of a second conductivity type opposite to the first conductivity type;
    bonding a first semiconductor wafer of the first conductivity type to a surface of the substrate;
    forming a first dielectric layer on an exposed surface of the first semiconductor wafer in an area where a JFET region is to be formed;
    bonding a second semiconductor wafer of the second conductivity type to the exposed surface of the first semiconductor wafer;
    forming a second dielectric layer in an area of an exposed surface of the second semiconductor wafer directly above the first dielectric layer; and
    implanting a dopant of the first conductivity type into the second semiconductor wafer in an area not covered by the second dielectric layer.

15. The method of claim 14 further comprising bonding a third semiconductor wafer of the first conductivity type to an exposed surface of the second semiconductor wafer.

16. The method of claim 15 further comprising:
    forming a third dielectric layer on an exposed surface of the third semiconductor wafer directly above the second dielectric layer;
    bonding a fourth semiconductor wafer of the second conductivity type to the exposed surface of the third semiconductor wafer;
    forming a fourth dielectric layer in an area of an exposed surface of the fourth semiconductor wafer directly above the third dielectric layer;
    implanting a dopant of the first conductivity type into the fourth semiconductor wafer in an area not covered by the fourth dielectric layer; and
    bonding a fifth semiconductor wafer of the first conductivity type to the exposed surface of the fourth semiconductor wafer.

17. The method of claim 14 comprising implanting a dopant of the second conductivity type into an area of the first semiconductor wafer not to be a part of the drift region.

18. The method of claim 14 wherein forming a first dielectric layer on an exposed surface of the first semiconductor wafer comprises:
    forming a mask layer on the exposed surface of the first semiconductor wafer;
    patterning the mask layer to form an opening in the area where the JFET region is to be formed; and
    thermally growing an oxide layer on the exposed surface of the first semiconductor wafer in the opening.

* * * * *